United States Patent [19]

Hunter

[11] Patent Number: 5,285,152
[45] Date of Patent: Feb. 8, 1994

[54] APPARATUS AND METHODS FOR TESTING CIRCUIT BOARD INTERCONNECT INTEGRITY

[75] Inventor: Paul W. Hunter, San Jose, Calif.

[73] Assignee: MiniStar Peripherals International Limited, San Jose, Calif.

[21] Appl. No.: 855,437

[22] Filed: Mar. 23, 1992

[51] Int. Cl.$^5$ .............................. G01R 15/12
[52] U.S. Cl. ............................. 324/158 R; 324/73.1
[58] Field of Search .............. 324/73.1, 158 R, 158 F; 371/22.3, 22.6; 307/303.1; 257/40, 48; 437/8

[56] References Cited

U.S. PATENT DOCUMENTS

| | | | |
|---|---|---|---|
| 4,509,008 | 4/1985 | DasGupta et al. | 371/22.3 |
| 4,697,267 | 9/1987 | Wakai | 371/22.3 |
| 4,701,921 | 10/1987 | Powell et al. | 371/22.3 |
| 5,043,985 | 8/1991 | Lin et al. | 371/22.3 |
| 5,132,635 | 7/1992 | Kennedy | 371/22.3 |

OTHER PUBLICATIONS

"IEEE Standard Test Access Port and Boundary Scan Architecture"; Aug. 17, 1990.

*Primary Examiner*—Vinh Nguyen
*Attorney, Agent, or Firm*—D'Alessandro, Frazzini & Ritchie

[57] ABSTRACT

Apparatus for observing circuit nodes in an analog integrated circuit includes a multiplexer connected to a plurality of circuit nodes to be observed, a sample/hold circuit for holding voltages obtained from the selected nodes, and a controller responsive to external signals for controlling the operation of the multiplexer and the sample/hold circuit.

7 Claims, 5 Drawing Sheets

APPARATUS AND METHODS FOR TESTING CIRCUIT BOARD INTERCONNECT INTEGRITY

BACKGROUND OF THE INVENTION

1. Field of the Invention

The present invention relates generally to integrated circuits, to integrated circuits assembled on circuit boards, and specifically to circuit boards containing more than one integrated circuit. More particularly, the present invention relates to apparatus and methods for testing the integrity of the interconnectivity between ones of the integrated circuits on the circuit board and for testing the functionality of analog integrated circuits assembled on circuit boards.

2. The Prior Art

Major portions of the manufacturing yield problem in electronics manufacturing are associated with the assembly process. It has been suggested that over 80% of the problems are related to missing and/or misplaced components and faulty integrated circuit interconnections. Less than 20% of the assembly yield problems are related to integrated circuit problems.

Numerous methods for testing integrated circuits and for testing assembled circuit boards exist in the prior art. Individual components may be tested by IC testers, and, when installed on a circuit board, digital integrated circuits may be tested by using boundary scanning techniques such as those described in the publication *Standard Test Access Port and Boundary Scan Architecture*, IEEE Standard 1149.1. Circuit boards may be tested using bed-of-nails testers and other manufacturing test equipment. As circuit board densities increase, bed-of-nails testing becomes a less viable alternative for several reasons.

Another problem which confronts the electronic industry is the testing of analog integrated circuit networks. Analog components and networks introduce significant disarray into self-test schemes. Unlike digital components and networks, it is difficult to utilize a single approach for testing the validity and functionality of analog components and networks. Known digital boundary scanning techniques are not applicable to testing in the analog environment.

It is an object of the present invention to provide an improved apparatus and method for testing integrated circuits and assemblies of integrated circuits, such as assembled circuit boards.

Another object of the present invention is to provide apparatus and methods for testing integrated circuits which eliminates as much as possible the use of manufacturing test equipment.

It is yet another object of the present invention to build self-testing capabilities into the assembled product itself.

BRIEF DESCRIPTION OF THE INVENTION

According to a first aspect of the present invention, apparatus is provided on a circuit board for allowing self testing the integrity of a plurality of conductive circuit connection paths between output pins on a first digital integrated circuit and input pins on a second digital integrated circuit on the circuit board. According to a presently preferred embodiment of the invention, first boundary scan cells are associated with each output pin on the first digital integrated circuit and each of the first boundary scan cells is adapted to selectively place a data test bit loaded therein onto the one of the output pins with which it is associated. Second boundary scan cells are associated with each input pin on the second digital integrated circuit and each of the second boundary scan cells is adapted to selectively store the digital value present on the one of the input pins with which it is associated. Control means, preferably in the form of a microcontroller, is provided on the circuit board for loading a data test bit into each of the boundary scan cells associated with each output pin on the first one of the digital integrated circuits, for respectively placing each of the data test bits onto respective ones of the output pins of the first digital integrated circuit, for selectively storing into each of the second boundary scan cells in the second digital integrated circuit the digital values present on the ones of the input pins associated therewith, and for comparing the digital values with the data test bits.

According to a second aspect of the present invention, a method is disclosed for testing the integrity of a plurality of conductive circuit connection paths between output pins on a first digital integrated circuit and input pins on a second digital integrated circuit on a circuit board includes forcing the output pins on the first digital integrated circuit to assume preselected digital values; reading the digital values present on the input pins of the second digital integrated circuit while the selected digital values are present on the output pins of the first digital integrated circuit; and comparing the preselected digital values on the output pins on the first digital integrated circuit with the digital values present on the input pins of the second digital integrated circuit. The steps of the method are performed on the circuit board and the instrumentalities which perform the steps are all located on the circuit board.

According to a third aspect of the present invention, apparatus is provided for testing the integrity of analog integrated circuits. In accordance with one aspect of the analog apparatus, a single analog integrated circuit is provided including one or more analog function circuits disposed in a circuit portion thereof. The function circuits contain one or more circuit nodes characterized by the presence of a characteristic voltage when the integrated circuit is properly connected and the function circuit is properly operating. An analog multiplexer is provided having a plurality of analog inputs, an analog output, and at least one control input. Each of the analog inputs is connected to a different one of the circuit nodes through a buffer. A sample/hold amplifier is provided having a sample input connected to the output of the analog multiplexer, an output, and a control input. The output is accessible from the outside of the integrated circuit. An analog scan controller drives the control inputs of said analog multiplexer, and the control input of said sample/hold amplifier. The controller is responsive to signals from outside the integrated circuit for controlling the analog multiplexer and the sample/hold amplifier. The integrated circuit may also include a three-state buffer amplifier having an input connected to the output of the sample/hold amplifier, an output connected directly or indirectly to an output pin of the integrated circuit and a three-state control input which is also controlled by the analog scan controller. For interpreting circuit node carrying signals which are not characterized by static DC analog voltage levels, signal-conditioning means may be connected between the circuit nodes and one of the analog inputs of the analog multiplexer. The signal-conditioning means may be used to convert the analog parameter to a stable voltage. An example of such a signal-conditioning means is an integrator circuit, which may be used to convert a repetitive signal, such as a clock signal, or other varying signal into a stable signal.

A diagnostic architecture for analyzing the functioning of a plurality of analog integrated circuits according to the present invention comprises a plurality of analog integrated circuits as described above, having their three-state buffer outputs wire ORed to an input line of an analog to digital converter. The output of the A/D converter is connected to the bus of a microcontroller. The microcontroller is connected by appropriate busses to the control inputs of the analog scan controllers of all of the analog integrated circuits to be analyzed, and provides test command signals to each of the analog integrated circuits.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention comprises apparatus and methods for self testing of the integrity of the connectivity of circuit boards containing a plurality of integrated circuits. The present invention incorporates circuitry for performing digital boundary-scan testing, such as disclosed in the publication *Standard Test Access Port and Boundary Scan Architecture*, IEEE Standard 1149.1. Those of ordinary skill in the art are knowledgeable concerning the details of this standard and of particular circuitry to implement this standard. IEEE Standard 1149.1 is expressly incorporated herein by reference.

Figure 1:
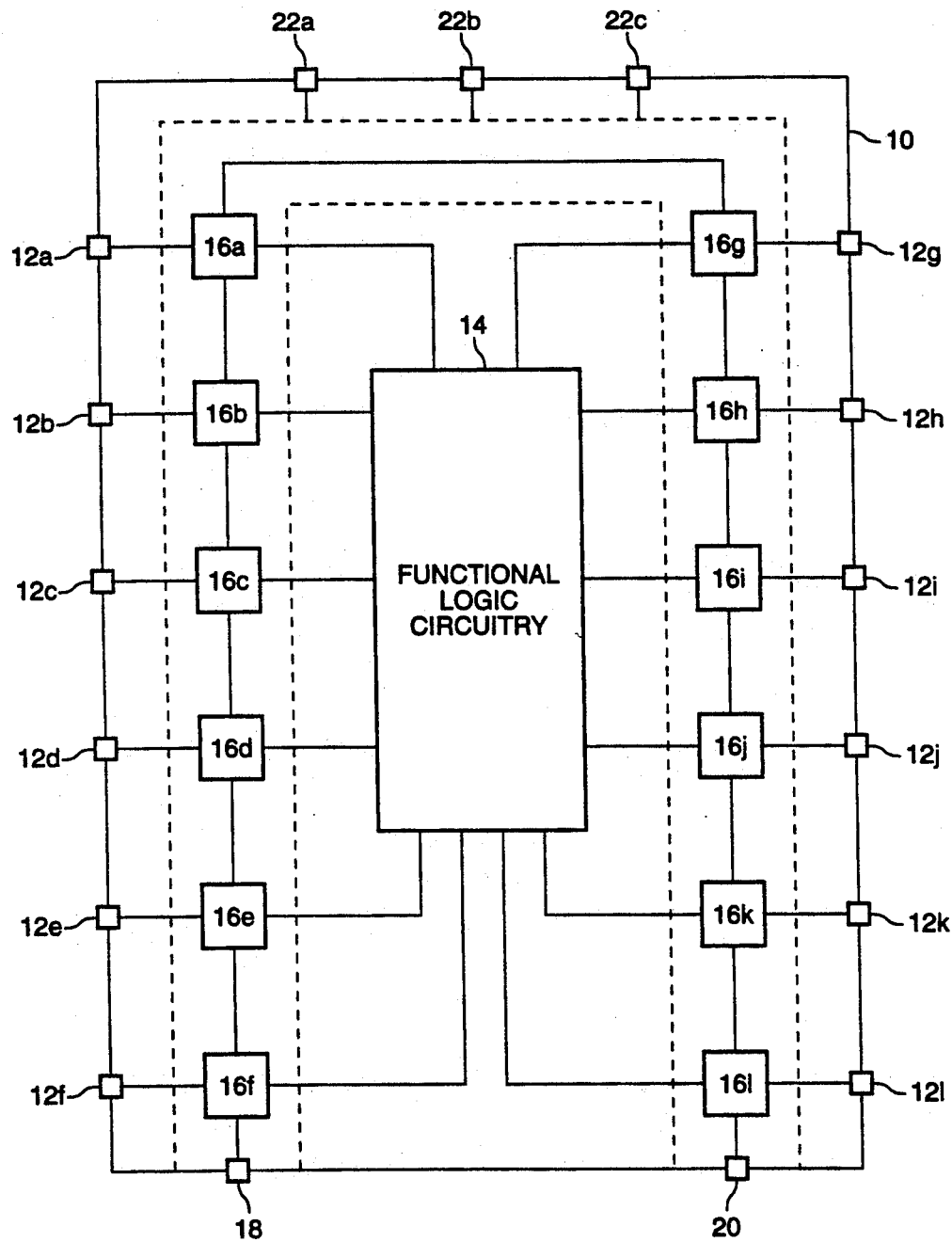
FIG. 1 is a block diagram of an integrated circuit for use in practicing the present invention including boundary scan cells associated with each of its input and output pins.

Referring first to FIG. 1, a block diagram of an integrated circuit for use in practicing the present invention including boundary scan cells associated with each of its input and output pins is shown. Integrated circuit 10 includes a plurality of input pins 12a-12f and output pins 12g-12l, which may be connected to internal logic circuitry, illustrated as block 14. Integrated circuit 10 also includes a plurality of boundary-scan cells 16a-16l, one of which corresponds to each of the input and output pins 12a-12l. Boundary-scan cells 16a-16l may be arranged as a serial shift register chain as fully described in IEEE Standard 1149.1. Integrated circuit 10 also includes a test data input pin 18 for the boundary-scan cell chain, a test data output pin 20 for the boundary-scan cell chain, and common boundary-scan cell control inputs 22a-22c. Typical boundary-scan cell control inputs would include a clock input 22a, a mode select input 22b, and a reset input 22c.

As those of ordinary skill in the art will appreciate from an understanding of the IEEE Standard 1149.1, the boundary-scan cell architecture of integrated circuit 10 allows testing of its functionality. As IEEE Standard 1149.1 teaches, the boundary-scan cell architecture of integrated circuit 10 allows input stimuli to be placed from ones of the boundary-scan cells 16a-16l into internal functional logic circuitry 14 as if it had been placed on input pins of the integrated circuit and allows the output of the internal logic circuitry 14 which would normally appear at the output pins of the integrated circuit 10 to be captured by other ones of the boundary-scan cells 16a-16l.

Figure 2:
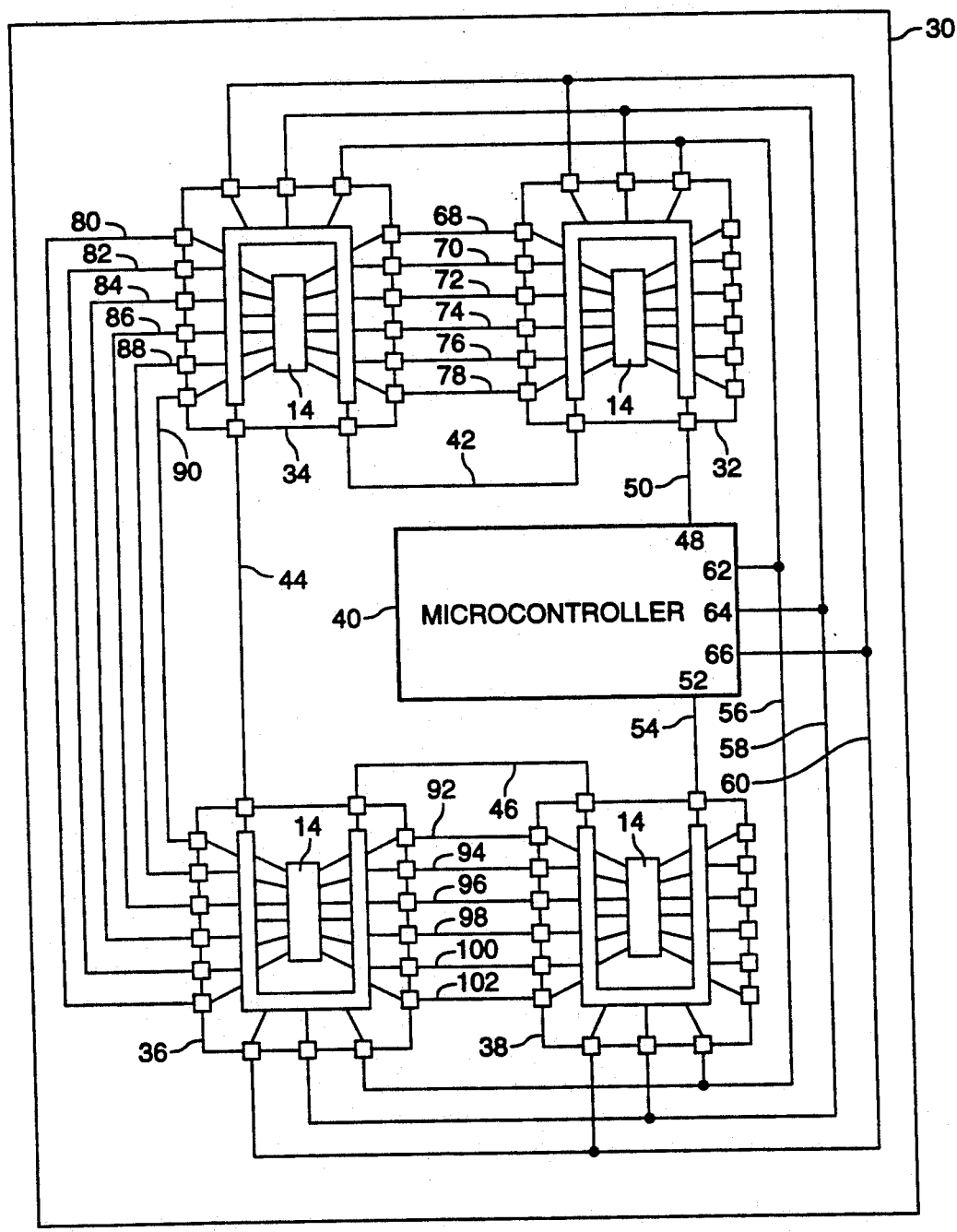
FIG. 2 is a block diagram of a circuit board including a plurality of integrated circuits including the apparatus of the present invention showing the relationships between the various elements of the present invention.

According to a first aspect of the present invention, the integrity of the numerous interconnections between a plurality of integrated circuits on a circuit board may be tested. Referring now to FIG. 2, a block diagram of an illustrative circuit board 30 including a plurality of integrated circuits 32, 34, 36, and 38, each including the apparatus of the present invention, shows the relationships between the various elements of the present invention.

A microcontroller 40 is also disposed on circuit board 30. Microcontroller 40 may be present as a functional portion of the circuitry disposed on circuit board 30 and may be used for the purposes of the present invention, or may be placed on circuit board 30 solely for the purposes of the present invention. Microcontroller 40 may be functionally equivalent to any one of a number of commercially available microcontrollers and may be modified in accordance with the requirements set forth in IEEE Standard 1149.1 to incorporate any necessary additional functionality required by that standard. IEEE Standard 1149.1 discloses the additional functions which the microcontroller would be forced to perform. The ability to perform such modifications to microprocessor architectures is well within the level of ordinary skill in the art.

The boundary-scan cell strings of integrated circuits 32, 34, 36, and 38 are connected together as a daisy chain series circuit by conductor 42, connected between the boundary-scan cell output pin of integrated circuit 32 and the boundary-scan cell input pin of integrated circuit 34, conductor 44, connected between the boundary-scan cell output pin of integrated circuit 34 and the boundary-scan cell input pin of integrated circuit 36, and conductor 46, connected between the boundary-scan cell output pin of integrated circuit 36 and the boundary-scan cell input pin of integrated circuit 38. A serial output pin 48 of microcontroller 40 is connected to the boundary-scan input pin of integrated circuit 32 by conductor 50 and a serial input pin 52 of microcontroller 40 is connected to the boundary-scan output pin of integrated circuit 38 by conductor 54. Control lines 56, 58, and 60 are connected between control outputs 62, 64, and 66 of microcontroller 40 and the boundary-scan cell control input pins (pins 22a, 22b, and 22c of FIG. 1) of integrated circuits 32, 34, 36, and 38. These control lines drive a TAP controller associated with the boundary-scan cells as described in IEEE Standard 1149.1, and descriptions of these control lines and their functions are found in IEEE Standard 1149.1.

As also shown in FIG. 2, output pins of integrated circuit 32 are connected to input pins of integrated circuit 34 by conductors 68, 70, 72, 74, 76, and 78. Similarly, output pins of integrated circuit 34 are connected to input pins of integrated circuit 36 by conductors 80, 82, 84, 86, 88, and 90, output pins of integrated circuit 36 are connected to input pins of integrated circuit 38 by conductors 92, 94, 96, 98, 100, and 102. By utilizing the present invention, the integrity of the connections between the various input and output pins of integrated circuits 32, 34, 36, and 38 may be tested. Those of ordinary skill in the art will readily recognize that the concept disclosed herein can be easily extended to circuit boards disposed on multiple circuit boards by enlarging the scan loop to encompass integrated circuit devices on additional circuit boards.

According to the present invention, the boundary-scan cell architecture in integrated circuits may be used to test the integrity of the signal paths between the outputs and inputs of the integrated circuits 32, 34, 36, and 36. These signal paths include the solder joints between the pins of the integrated circuit and the circuit board 30 and the conductors 68, 70, 72, 74, 76, 78, 80, 82, 84, 86, 88, 90, 92, 94, 96, 98, 100, and 102. The conductors may comprise the traces on a printed circuit board, wire-wrapped connections, and the like.

Under the control of microcontroller 40, a serial string of test data bits is loaded by clocking into the serial chain of boundary-scan cells such that a known pattern exists at the output pins of integrated circuits 32, 34, 36, and 38. The logic levels at the input pins of integrated circuits 32, 34, 36, and 38 are then latched into the boundary-scan cells associated with those input pins. The contents of the boundary-scan cell chain is then scanned back into microcontroller 40 and the logic values captured from the input pins of integrated circuits 32, 34, 36, and 38 are compared with the values expected from the known pattern. A mismatch indicates a faulty interconnect path. The particular bit position of the mismatch identifies the particular faulty interconnect path.

From the description herein of the present invention, those of ordinary skill in the art will realize that a circuit board architecture has been described having the capability of performing self testing of printed circuit board level and even higher circuit level networks. The ability to inject signals into chosen input pins of selected integrated circuits in an electronic system provides a high level of not only assembly verification tests but also provides for a significant level of functional testing. Those of ordinary skill in the art will also recognize that partially assembled circuit boards may be tested according to the present invention by completing the scan loops left open by the missing integrated circuits which have not yet been placed on the circuit board or boards.

Figure 3:
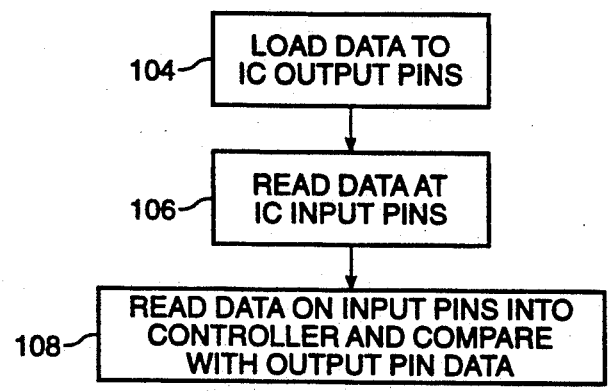
FIG. 3 is a flow diagram of an exemplary software routine which may be employed with the embodiment of the present invention depicted in FIG. 2.

Referring now to FIG. 3, a flow diagram is presented of an exemplary software routine which may be employed with the embodiment of the present invention depicted in FIG. 2. First, at step 104, the serial string of test data bits is loaded into the boundary-scan cells associated with the output pins of the integrated circuits by clocking into the serial chain of boundary-scan cells. Next, at step 106, the logic levels present at the input pins of the integrated circuits are read into the boundary-scan cells associated with the input pins of the integrated circuits. Finally, at step 108, the data in the boundary-scan cells are read into the controller and compared with the data which was written to the boundary-scan cells associated with the output pins.

Figure 4:
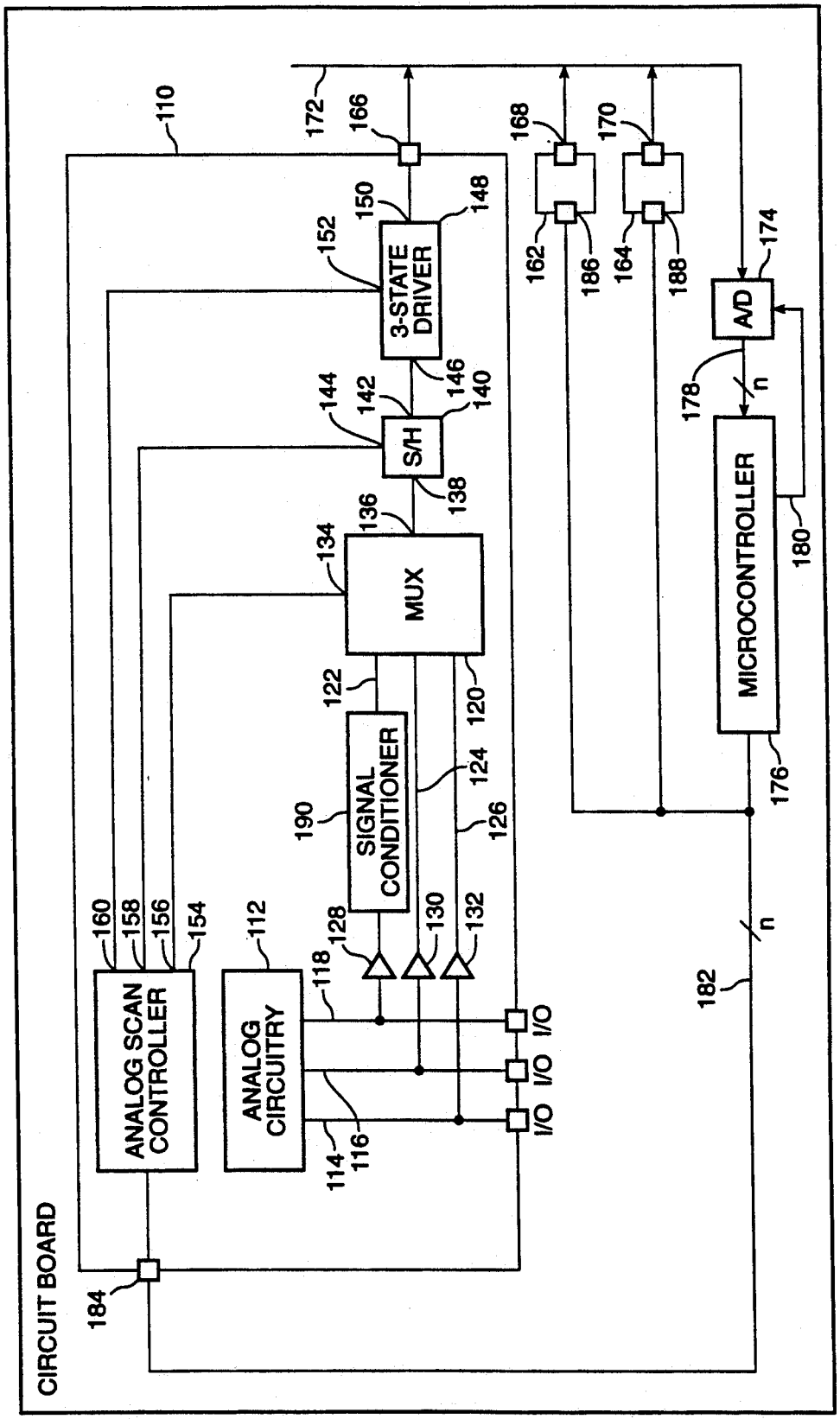
FIG. 4 is a block diagram of an analog integrated circuit adapted for use in practicing the present invention and a block diagram of an analog version of apparatus according to the present invention.
Figure 4A:
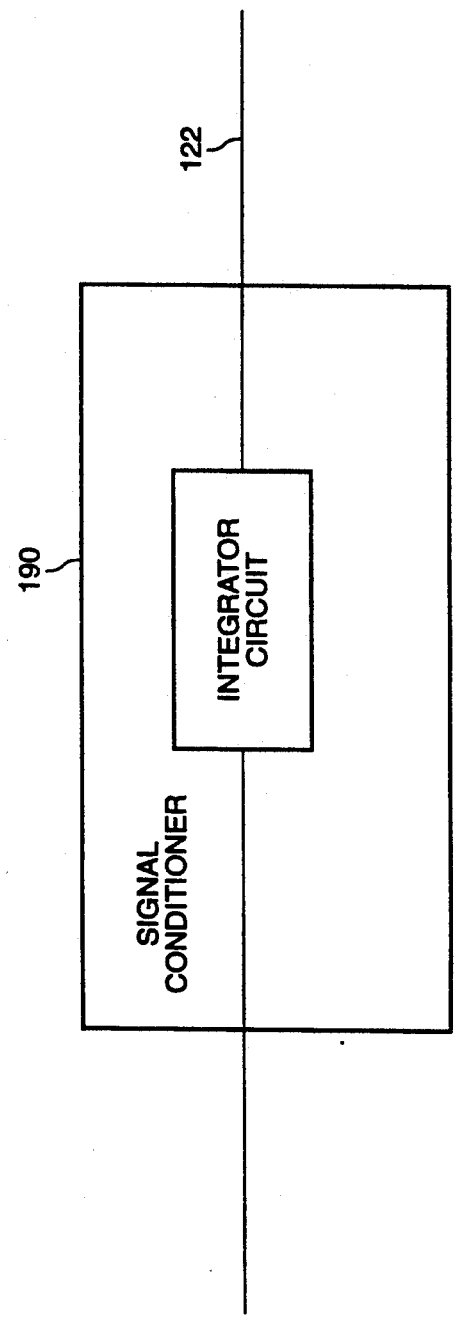
FIG. 4A is a block diagram of a signal conditioner comprising an integrator circuit.

IEEE Standard 1149.1 does not deal with analog signals. Referring now to FIG. 4, a block diagram of an analog integrated circuit adapted for use in practicing the present invention and a block diagram of an analog version of apparatus according to the present invention are shown. Integrated circuit 110 includes functional analog circuitry 112 having a plurality of analog circuit nodes 114, 116, and 118. In the illustrative embodiment disclosed in FIG. 4, three circuit nodes communicating with input/output pins (labelled I/O in FIG. 4) are shown. These I/O pins could be used to provide power supply potentials, clock or other control signals, or provide analog output signals for analog integrated circuit 110. Those of ordinary skill in the art will readily recognize that the embodiment disclosed with reference to FIG. 4 is illustrative only, and that the present invention can be used with an arbitrary number of circuit nodes and further that these nodes need not communicate directly with input/output pins of the integrated circuit 110.

An analog multiplexer 120 has a plurality of analog inputs 122, 124, and 126, connected to circuit nodes 114, 116, and 118 through buffer amplifiers 128, 130, and 132. Analog multiplexer 120 includes at least one control input 134 which may be used to select which one of its analog inputs is passed through to its output 136. The structure and operation of analog multiplexers is well known to those of ordinary skill in the art and will thus not be disclosed herein.

Output 136 of analog multiplexer 120 is connected to sample input 138 of sample/hold amplifier 140. Sample/hold amplifier 140 passes an analog voltage value from sample input 138 to output 142 or holds the value present at the input 138 depending on the state of control input 144. The structure and operation of sample/hold amplifiers is well known to those of ordinary skill in the art and will thus not be disclosed herein.

Output 142 of sample/hold amplifier 140 is connected to the input 146 of three-state buffer driver 148. Output 150 of three-state buffer driver 148 is either at a state related to its input state or at a high impedance state depending on the signal at its three-state control input 152. The structure and operation of three-state buffer drivers is well known to those of ordinary skill in the art and will thus not be disclosed herein.

Analog scan controller 154 has outputs 156, 158, and 160 which drive the at least one control input 134 of multiplexer 120, the control input 144 of sample/hold amplifier 140, and three-state control input 152 of three-state buffer driver 148 in response to control signals presented on inputs of analog scan controller 154. Analog scan controller 154 may also include provision for supplying an externally supplied clock signal to a selected internal node or nodes in response to a control word supplied to it.

Three-state buffer driver 148 is useful in testing in circuit board systems which include a plurality of analog integrated circuits. Such a system is shown in FIG. 4 including analog integrated circuit 110, shown in detail, and analog integrated circuits 162, and 164. While analog integrated circuits 162 and 164 are shown as simple rectangles in FIG. 4, those of ordinary skill in the art will recognize that each could have an internal structure similar to that depicted for analog integrated circuit 110. If each of analog integrated circuits 110, 162, and 164 is provided with a three-state buffer driver such as driver 148 of analog integrated circuit 110 in FIG. 4, the three-state buffer driver outputs 150 of all such integrated circuits, shown terminating at input-/output pins 166, 168, and 170, could be wire-ORed to a common line 172.

As shown in FIG. 4, the outputs of the analog scan architecture of the present invention contained in one or more analog integrated circuits present on line 172 are presented, one at a time, to analog-to-digital (A/D) converter 174. A/D converter 174 may be a conventional A/D converter, well known in the art, having a resolution chosen to be capable of resolving the analog voltage input to increments required by the testing scheme. For example, an 8-bit A/D converter will resolve the analog input voltage to one part in 256. Particular resolution chosen will depend on the requirements of the particular design.

The testing architecture of the embodiment of the present invention depicted in FIG. 4 is controlled by microcontroller 176. As in the digital embodiment disclosed with reference to FIGS. 1 and 2, microcontroller 176 may be present on the circuit board as a part of the functional circuitry or may be added to provide the additional functionality taught by the present invention. The output of A/D converter 174 is presented to microcontroller 176 via n-bit bus 178, and convert commands may be sent to A/D converter 174 via control line 180.

In addition, microcontroller 176 sends commands in the form of instructions or control words to analog scan controller 154 in analog integrated circuits 110, 162, and 164 via n-bit bus 182 and their respective one or more input pins shown symbolically as a single input pin 184 on analog integrated circuit 110 and as single input pins 186 and 188, respectively, on analog integrated circuits 162 and 164. Those of ordinary skill in the art will recognize that commands could easily be sent serially to analog scan controller 154, there merely being design tradeoffs to be considered in making a particular choice. Serial and parallel interface techniques are well known in the microcontroller art, and thus details of any particular interface will not be disclosed herein to avoid over-complicating the disclosure and thus obscuring the present invention. As presently preferred, the TAP interface described in IEEE Standard 1149.1 may be used.

In the parallel command word embodiment disclosed in FIG. 4, analog scan controller 154 in analog integrated circuit 110 responds to multibit commands from microcontroller 176 to operate multiplexer 120, sample/hold amplifier 140 and three-state buffer driver 148 and to thus provide information about the magnitudes of analog parameters at the chosen circuit nodes of analog integrated circuit 110 back to microcontroller 176. Numerous well-known techniques may be used to implement this function. In one embodiment, coded instructions may be used to specify the control word for the analog multiplexer control inputs 134, the state of control input 144 of sample/hold amplifier 140 and the state of three-state control input 152 of three-state buffer driver 148. Similarly, the analog scan controllers in analog integrated circuits 162 and 164 may be controlled by microcontroller 176. Design of particular software routines to accomplish such control depend on the choice of a particular microcontroller device as well as the particular architecture, and are well within the level of ordinary skill in the art.

By using the invention as thus far described with reference to FIG. 4, the condition of any of the selected signal nodes in any of the analog integrated circuits 110, 162, and 164 may be reported to microcontroller 176. As an illustrative example of the operation of the testing architecture of the present invention, a plurality of analog integrated circuits mounted on a circuit board may be tested to determine if the connections to power supply voltages and reference voltages have been properly made thereto. The power supply pins of the integrated circuits are designated as circuit nodes to be tested and the integrated circuits are thus fabricated with connections from the individual power supply pins and reference voltage input pins to the input of the analog multiplexers on each analog integrated circuit. In the case of internal voltage references, connection is made from the appropriate circuit node in the reference voltage circuit to an input of the analog multiplexer.

The present invention may be used to test inputs or circuit nodes on which the analog parameter, such as voltage, is not static, or on which the desired parameter is not a voltage, such as in the case of a current source. In such an instance, a signal conditioner may be employed. Such a signal conditioner is shown in block form at reference numeral 190, and may comprise, for example, an integrator circuit where the circuit node to be observed is a clock signal node or a signal node upon which a varying voltage level is expected to be encountered, or a resistor if a current source is to be monitored. Both of these elements are well known in the art.

Figure 5:
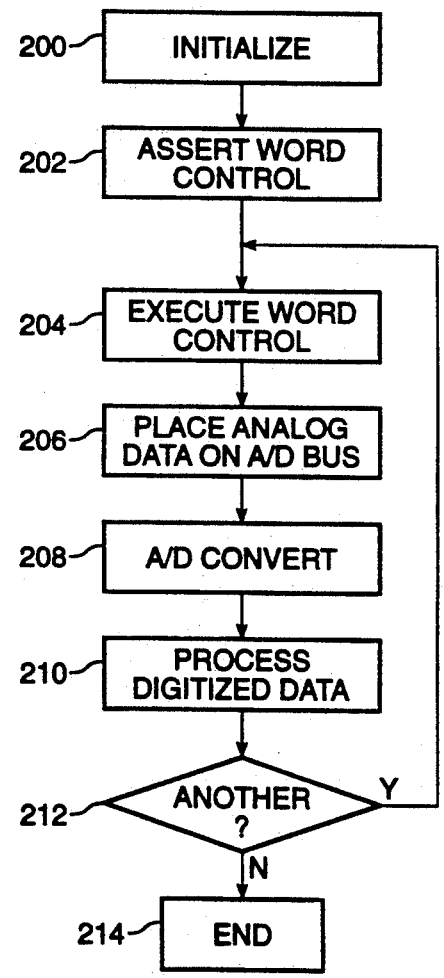
FIG. 5 is a flow diagram of an exemplary software routine which may be employed with the embodiment of the present invention depicted in FIG. 4.

A software routine is employed to interrogate all of the circuit nodes which are desired to be observed, and the digitized values reported back to the microcontroller 176 by the A/D converter 174 are compared with expected values. Any deviation from the expected values is reported and may be used simply to reject an assembled circuit board, or to perform analysis, etc. Numerous possibilities exist for those of ordinary skill in the art to develop such a software routine, and an illustrative example is given in FIG. 5, a flow diagram of an exemplary routine to be employed with the present invention.

First, an initialization routine may be performed in which various system counters and registers are initialized, if necessary. This step is conventional and is shown at step 200. This step may, for example, include clocking an instruction into an instruction register of the analog scan controller 154 in accordance with the protocol described in IEEE Standard 1149.1. Next, at step 202, a control word is asserted on the microcontroller bus and placed into analog scan controller 154. Depending on the nature of the control word and the bus, the control word may be latched into the analog scan controllers of one or more analog integrated circuit on the circuit board. Next, at step 204, the control word is executed in the analog scan controllers to provide drive control signals onto the control lines of analog multiplexer 120, sample/hold amplifier 140, and three-state buffer driver 148 of the integrated circuits on the circuit board. Next, at step 206, only one three-state buffer driver is allowed to drive line 172.

Next, at step 208, microcontroller 176 issues a convert command to A/D converter 174 to perform a conversion and at step 210, the digital value from A/D converter 174 is compared with an expected value. Those of ordinary skill in the art recognize that all values could be first stored and then compared at a later time after all data has been gathered.

Next, at step 212, it is determined if there is another analog value to be evaluated. If not, the routine terminates at step 214. If so, the routine loops back to step 204, where another analog value is placed on line 172 by assertion of a second control word or by advancing a state machine in analog scan controller 154. Those of ordinary skill in the art recognize that all data from a single analog integrated circuit can be gathered before proceeding to the next analog integrated circuit, or that the routine can alternately interrogate different analog integrated circuits. The routine then proceeds again through steps 208, 210, and 212.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An analog integrated circuit comprising:
   a test access port including input and output pins;
   at least one analog function circuit disposed in a circuit portion of the analog integrated circuit, said analog function circuit(s) each including at least one circuit node, said circuit node(s) characterized by the presence of a characteristic voltage when the analog integrated circuit is properly connected and said analog function circuit(s) is properly operating;
   an analog multiplexer having a plurality of analog inputs, an analog output, and at least one control input, each of said analog inputs connected to a different one of said circuit nodes through a buffer;
   a sample/hold amplifier having a sample input connected to said analog output of said analog multiplexer, an output, and a control input;
   an analog scan controller having at least one input, and having a first output connected to said control input of said analog multiplexer, and a second output connected to said control input of said sample/hold amplifier, said analog scan controller responsive to signals applied to said test access port for controlling said analog multiplexer and said sample/hold amplifier.

2. The analog integrated circuit of claim 1, further comprising:
   a three state buffer amplifier having an input connected to said output of said sample/hold amplifier, an output operatively connected to one of said test access port output pins, and a three-state control input; and
   said analog scan controller further including a third output connected to said three-state control input of said three-state buffer amplifier, wherein said three-state buffer amplifier is responsive to signals applied to said test access port.

3. The integrated circuit of claim 1 further comprising:
   an additional circuit node in said analog integrated circuit, said additional circuit node characterized by the presence of a characteristic signal thereon when said analog function circuit is properly connected and operating; and
   signal-conditioning means connected between said additional circuit node and one of said analog inputs to said analog multiplexer, said signal-conditioning means configured to convert said characteristic signal to a stable voltage.

4. The analog integrated circuit of claim 3, wherein said signal-conditioning means comprises an integrator circuit.

5. A diagnostic architecture for analyzing the functioning of a plurality of analog integrated circuits, said architecture comprising:
   a test access port including input and output pins;
   a plurality of analog integrated circuits, each of said analog integrated circuits having: at least one analog function circuit disposed in a circuit portion of one of the analog integrated circuits, said analog function circuit including at least one circuit node, said circuit node characterized by the presence of a characteristic analog voltage signal when said function circuit is properly connected and operating,
   an analog multiplexer having a plurality of analog inputs, an analog output, and at least one control input, each of said analog inputs connected to a different one of said circuit nodes through a buffer,
   a sample/hold amplifier having a sample input connected to the output of said analog multiplexer, an output, and a control input,
   a three-state buffer amplifier having an input connected to said output of said sample/hold amplifier, an output operatively connected to one of said test access port output pins, and a three-state control input, and
   an analog scan controller having at least one input, and having a first output connected to said control input of said analog multiplexer, a second output connected to said control input of said sample/hold amplifier, and a third output connected to said three-state control input of said three-state buffer amplifier, said analog scan controller responsive to test command signals applied to said test access port for controlling said analog multiplexer, said sample/hold amplifier, and said three-state buffer amplifier;
   a common analog signal line connected to said outputs of said three-state buffer amplifiers of the analog integrated circuits;
   an A/D converter having an analog input connected to said common analog signal line, and a digital output bus for communicating digital output data representing said characteristic analog voltage signals;
   microcontroller means, operatively connected to the plurality of analog integrated circuits and to said A/D converter, for providing said test command signals to each of the analog integrated circuits, for obtaining digital output data from said A/D converter, and for comparing said digital output data with predetermined values.

6. The diagnostic architecture of claim 5 further comprising:
   an additional circuit node in at least one of the analog integrated circuits, said additional circuit node characterized by the presence of a characteristic signal thereon when said analog function circuit is properly connected and operating; and
   signal-conditioning means connected between said additional circuit node and one of said analog inputs to said analog multiplexer, said signal-conditioning means configured to convert said characteristic signal to a stable voltage.

7. The diagnostic architecture of claim 6, wherein said signal-conditioning means comprises an integrator circuit.

* * * * *

UNITED STATES PATENT AND TRADEMARK OFFICE
CERTIFICATE OF CORRECTION

PATENT NO. : 5,285,152

DATED : February 8, 1994

INVENTOR(S) : Paul W. Hunter

It is certified that error appears in the above-identified patent and that said Letters Patent is hereby corrected as shown below:

On the Title Page:
In the Assignee, change "Ministar" to --MiniStor--,

Column 1, line 60, change "self testing" to --self-testing--,

Column 10, line 9, after "having:", begin a new paragraph.

Signed and Sealed this

Twenty-third Day of August, 1994

Attest:

BRUCE LEHMAN

Attesting Officer

Commissioner of Patents and Trademarks